US008824190B1

United States Patent
Kim et al.

(10) Patent No.: US 8,824,190 B1
(45) Date of Patent: Sep. 2, 2014

(54) MEMORY STATE SENSING BASED ON CELL CAPACITANCE

(71) Applicant: International Business Machines Corporation, Armonk, NY (US)

(72) Inventors: SangBum Kim, Stamford, CT (US); Chung H. Lam, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/785,602

(22) Filed: Mar. 5, 2013

(51) Int. Cl.
*G11C 11/24* (2006.01)
*G11C 7/00* (2006.01)
*G11C 7/06* (2006.01)
*G11C 11/404* (2006.01)
*G11C 11/4091* (2006.01)
*G11C 13/00* (2006.01)

(52) U.S. Cl.
CPC .............. *G11C 11/24* (2013.01); *G11C 11/404* (2013.01); *G11C 11/4091* (2013.01); *G11C 13/004* (2013.01)
USPC ......... 365/148; 365/149; 365/189.15; 365/63

(58) Field of Classification Search
CPC .... G11C 13/004; G11C 11/24; G11C 11/404; G11C 11/4091
USPC ........................ 365/145, 148, 149, 189.15, 63
See application file for complete search history.

(56) References Cited

U.S. PATENT DOCUMENTS

| 2003/0103372 | A1* | 6/2003 | Matsushita | 365/145 |
| 2005/0237840 | A1* | 10/2005 | Diorio et al. | 365/225.7 |
| 2011/0227023 | A1 | 9/2011 | Bethune et al. | 257/4 |

OTHER PUBLICATIONS

Gerstner E.G. et al., Nonvolatile memory effects in nitrogen doped tetrahedral amorphous carbon thin films, Journal of Applied Physics, vol. 84, No. 10, Nov. 15, 1998, 5647-5651.

* cited by examiner

*Primary Examiner* — Ly D Pham
(74) *Attorney, Agent, or Firm* — Ido Tuchman; Louis J. Percello

(57) ABSTRACT

A memory cell and method for operating a memory cell including a bidirectional access device and memory element electrically coupled in series. The bidirectional access device includes a tunneling capacitance. The memory element programmable to a first and second state by application of a first and second write voltage opposite in polarity to one another. The memory element has a lower capacitance in the first state than the second state. A read unit senses a transient read current due to a voltage drop upon application of a read voltage. Determining if the memory element is the first or second state is based on whether the read current is greater or less than a sense threshold. The sense threshold is based on a capacitance ratio between the first and second state.

13 Claims, 7 Drawing Sheets

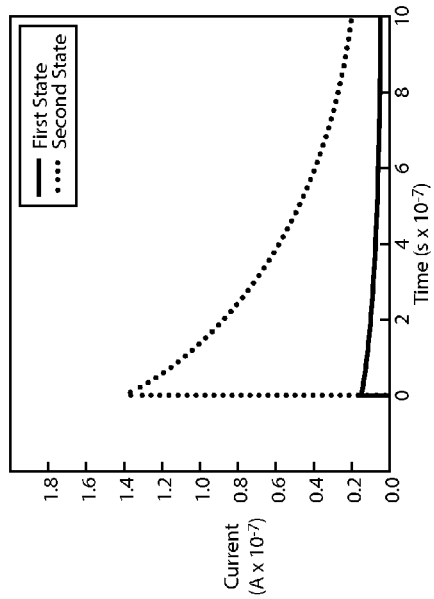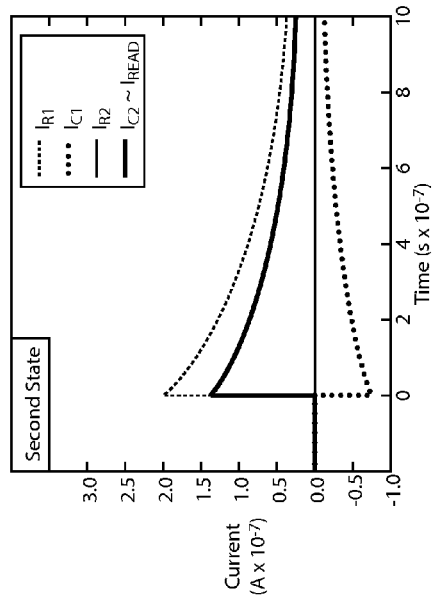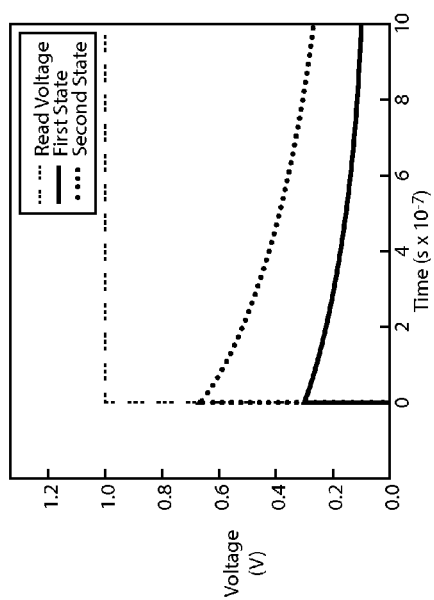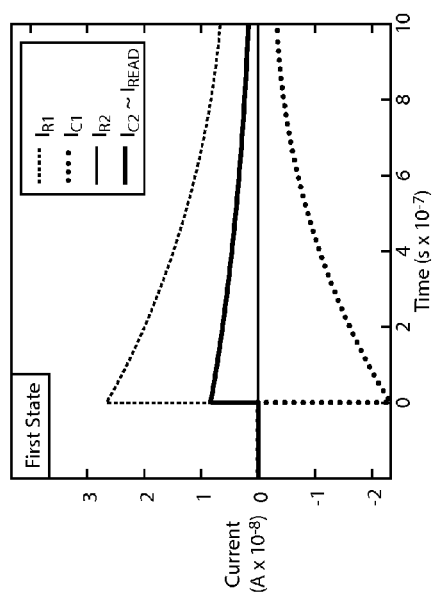
FIG. 4A
FIG. 4B
FIG. 4C
FIG. 4D

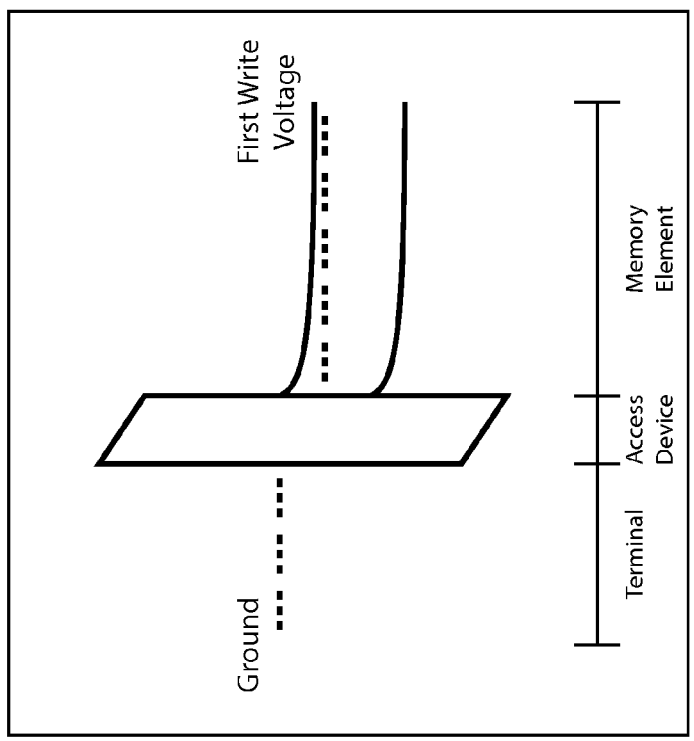

MEMORY STATE SENSING BASED ON CELL CAPACITANCE

BACKGROUND

The present invention relates to memory device technology. More particularly, the present invention relates to memory cell structure and operation mechanisms.

In conventional memory technologies such as phase change memory and metal oxide memory, the fundamental data storage mechanism is resistance change. Phase change memory, for example, utilizes the difference in resistance between a material's crystalline and amorphous states to create binary data storage. However, as the drive to scale down memory cell size continues, the resistance of such memory cells increases and the amount of current during read operations decreases. As a result, speed and reliability of read operations become an issue.

Read current can be increased by using more conductive memory cell materials. However, more conductive memory cells requires greater programming current as well, which is not suitable for high density memory arrays. Additionally, ease of integration and cost efficiency exist as issues to be considered. Thus, a new memory cell not limited to the aforementioned issues would be beneficial.

BRIEF SUMMARY

An aspect of the invention is a memory cell including a bidirectional access device. The bidirectional access device includes a tunneling capacitance. The memory cell also includes a memory element electrically coupled in series with the access device. The memory element is programmable to one of a first state by application of a first write voltage, and a second state by application of a second write voltage. The second write voltage is opposite in polarity to the first write voltage. The memory element includes a first capacitance at the first state and a second capacitance at the second state, where the first capacitance being lower than the second capacitance. The memory cell further includes a read unit configured to sense a transient read current due to a voltage drop across the memory element and the bidirectional access device upon application of a read voltage.

Another aspect of the invention is a method for operating a memory cell. The method includes applying a read voltage across a memory element and bidirectional access device. The memory element is programmable to one of a first state and a second state. Furthermore, the memory element has a first capacitance at the first state and a second capacitance at the second state, with the first capacitance being lower than the second capacitance. The method also includes sensing a transient read current due to a voltage drop across the memory element and bidirectional access device. The method further includes determining if the memory element is the first state or the second state based on whether the transient is greater or less than a sense threshold. The sense threshold is determined based on a ratio between the first capacitance and the second capacitance.

BRIEF DESCRIPTION OF THE DRAWINGS

FIG. 4A is a graphical representation of voltage as a function of time during a read interval in accordance to one embodiment of the present invention.

FIG. 4B is a graphical representation of current as a function of time during a read interval in accordance to one embodiment of the present invention.

FIG. 4C is a graphical representation of current as a function of time while the memory element is in the first state in accordance to one embodiment of the present invention.

FIG. 4D is a graphical representation of current as a function of time while the memory element is in the second state in accordance to one embodiment of the present invention.

FIG. 6A is a schematic diagram of electrons tunneling through the bidirectional access device during a first write operation in accordance to one embodiment of the present invention.

FIG. 6B is table depicting the bias condition per terminal during a first write operation in accordance to one embodiment of the present invention.

DETAILED DESCRIPTION

The present invention is described with reference to various embodiments of the invention. Throughout the description of the invention, reference is made to FIG. 1 through FIG. 8.

Additionally, relative terms, such as "first" and "second" are employed with respects to other elements in the described embodiments and figures. Such terms are meant only to describe the referenced embodiments. Therefore, the present invention encompasses alternative orientations and configurations of the suggested embodiments.

Embodiments of the present invention provide possible configurations and methods for operating a memory cell including a memory element and bidirectional access device. An aspect of the present invention teaches the use of wide band gap materials for the memory element in conjunction with the use of a tunneling insulator for the bidirectional access device.

In an embodiment, the memory element has a first capacitance in a first state and a second capacitance in a second state. The first capacitance is substantially lower than the second capacitance. The memory element material also has a first resistance in the first state and a second resistance in the second state, wherein the first resistance is substantially higher than the second resistance. The tunneling insulator material in the bidirectional access device includes a tunneling capacitance and provides a sharp increase in current as voltage increases.

Figure 1:
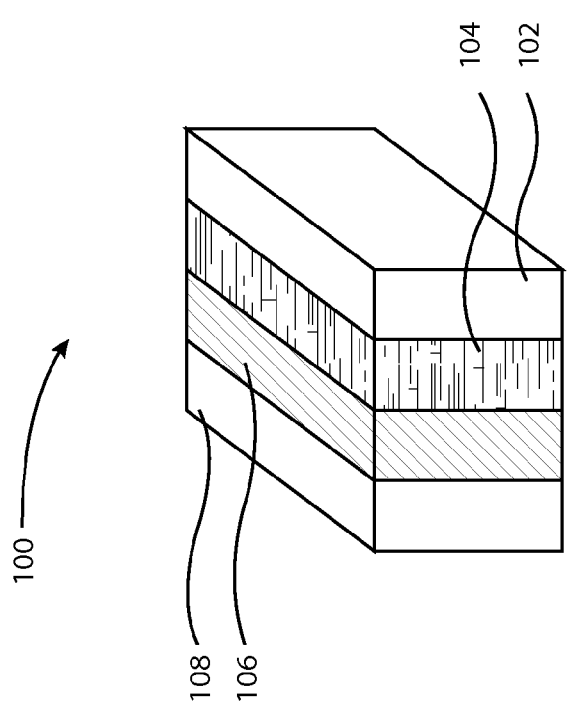
FIG. 1 schematically depicts a three-dimensional view of a memory cell in accordance to one embodiment of the present invention.

FIG. 1 schematically depicts a three-dimensional view of a memory cell 100 in accordance to one embodiment of the present invention. This embodiment includes a first terminal 102 electrically coupled to a memory element 104. The memory element 104 is electrically coupled in series circuit with a bidirectional access device 106. The bidirectional access device 106 is electrically coupled to a second terminal 108. In this embodiment, the memory cell has a stacked structure.

The memory element 104 is comprised of a wide bandgap material such as, amorphous carbon, silicon carbide, aluminum nitride, gallium nitride, or nitrogen doped amorphous carbon. The wide bandgap material provides a substantial capacitance difference between the first state and second state, in addition to the conventional difference in resistance. Thus, read currents between the first state and second state are separated further than a conventional resistive memory element. Furthermore, the amplitude of a read current can be increased for greater signal-to-noise ratio and faster read operations. In some embodiments, the thickness of the memory element 104 is equal or greater than five nanometers.

The bidirectional access device 106 is comprised of a tunneling insulator material such as, silicon oxide, aluminum oxide, hafnium oxide, or magnesium oxide. The tunneling insulator material provides a greater increase in current as voltage increases. In some embodiments, the thickness of the bidirectional access device 106 is within the range of one and five nanometers. In one embodiment, at least one physical dimension of the bidirectional access device 106 is based on the maximization of the read current. In one embodiment, at least one physical dimension of the bidirectional access device 106 is based on maximization of the integral of the read current throughout a read interval.

Figure 2:
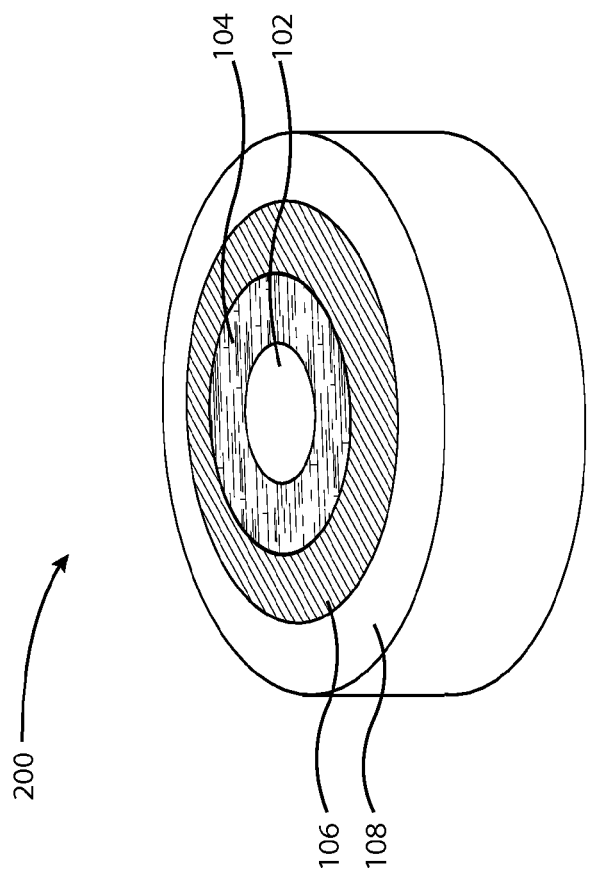
FIG. 2 schematically depicts a three-dimensional view of a memory cell in accordance to one embodiment of the present invention.

FIG. 2 schematically depicts a three-dimensional view of a memory cell 200 in accordance to one embodiment of the present invention. This embodiment also includes the first terminal 102, memory element 104, bidirectional access device 106, and second terminal 108.

Figure 3A:
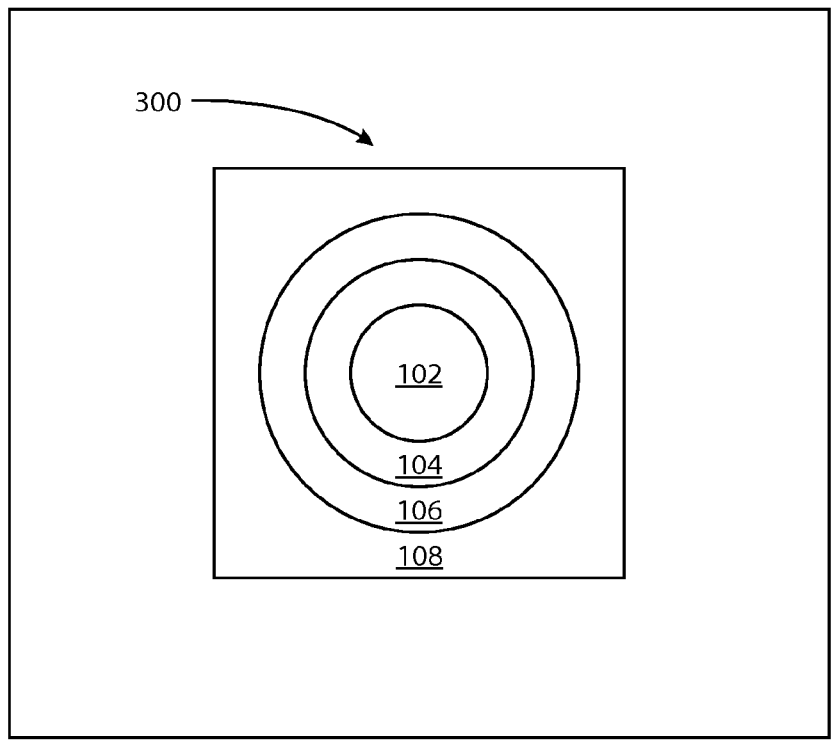
FIG. 3A schematically depicts a two-dimensional view of a memory cell in accordance to one embodiment of the present invention.

FIG. 3A schematically depicts a two-dimensional view of a memory cell 300, in accordance to one embodiment of the present invention. This embodiment also includes the first terminal 102, memory element 104, bidirectional access device 106, and second terminal 108, and is also configured in a cylindrical structure.

Figure 3B:
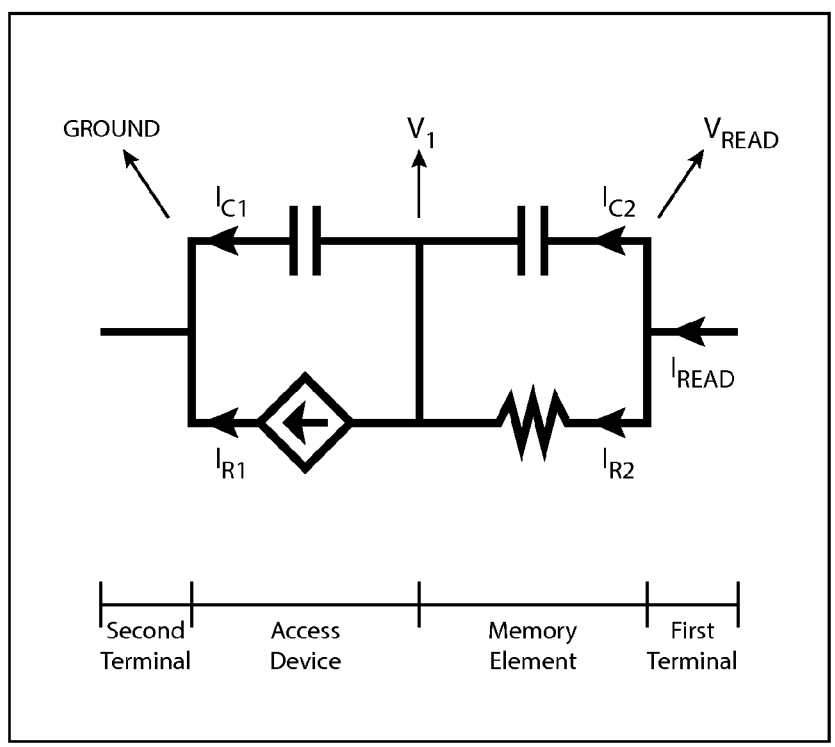
FIG. 3B schematically depicts a simplified equivalent circuit model of a memory cell during a read operation in accordance to one embodiment of the present invention.

FIG. 3B schematically depicts a simplified equivalent circuit model of a memory cell during a read operation, in accordance to one embodiment of the present invention. $I_{C1}$ represents the current due to the capacitive component of the bidirectional access device 106, $I_{R1}$ represents the current due to the resistive component of the bidirectional access device 106, $I_{c2}$ represents the current due to the capacitive component of the memory element 104, and $I_{R2}$ represents the current due to the resistive component of the memory element 104. $V_{READ}$ and $I_{READ}$ represent a read voltage and a read current, respectively. The resistive component of the bidirectional access device 106 is indicated as a non-linear, voltage-dependent current source (diamond with arrow). The read current can be represented from its components in the following equation:

$$I_{READ} = I_{C1} + I_{R1} = I_{C2} + I_{R2}$$

In some embodiments, the dimensions of the bidirectional access device 106 can be based on two aspects. The first aspect is the maximization of the read current at t=0 (beginning of the read interval). This can found with the assistance of the following equation:

$$I_{READ} = I_{R1}\left(\frac{C_2}{C_1+C_2}\right) + I_{R2}\left(\frac{C_1}{C_1+C_2}\right)$$

For example, at infinite thickness, $C_1=0$ and $R_1=0$, resulting in $I_{READ}=0$. Likewise, at zero thickness, $I_{READ}$ is also zero, as $C_1$=infinity and $I_{R2}$=0. Additionally, $I_{R2}$ and $C_2$ are dependent on the thickness and material of the memory element 104, therefore, the optimal thickness of the bidirectional access device 106 is dependent on the memory element 104.

The second aspect is the maximization of the integral of the read current throughout the read interval. This can found with the assistance of the following equation:

$$\int_0^{t_{READ}} I_{READ}\,dt$$

As with the first aspect, limitations exist in the thickness of the bidirectional access device 106. At infinite thickness, $I_{READ}=0$ throughout. At zero thickness, $\int_0^{t_{READ}} I_{READ} dt$ less thank $t_{READ}*I_{R2\ max}$, therefore, no amplification effect of the capacitance exists. As a result, an optimal thickness of the bidirectional access device can depend a balancing of at least the aforementioned aspects.

FIGS. 4A-4D are graphical representations of voltage and current throughout the memory cell during a read interval. The capacitive and resistive elements are in reference to the example equivalent circuit model in FIG. 3B. FIG. 4A is a graphical representation of voltage as a function of time during a read interval, in accordance with one embodiment of the present invention. The read voltage ($V_{READ}$) displayed is the applied voltage during the read interval. In a preferred embodiment, at t=0, the read voltage is divided by the capacitance ratio. Theoretically, at t=infinity, the voltage is divided by the resistive components (R1 and R2). The first state and second state voltages displayed are the voltages that would be sensed at junction V.

FIG. 4B is a graphical representation of current as a function of time during a read interval, in accordance to one embodiment of the present invention. This figure illustrates the current difference between the first state and the second state.

FIG. 4C is a graphical representation of current as a function of time, while the memory element is in the first state, in accordance to one embodiment of the present invention. The current as sensed from each equivalent circuit model element is plotted against time.

FIG. 4D is a graphical representation of current as a function of time, while the memory element is in the second state, in accordance to one embodiment of the present invention. The current as sensed from each equivalent circuit model element is plotted against time. Note the order of magnitude difference in current from FIG. 4C.

Figures 5A, 5B:
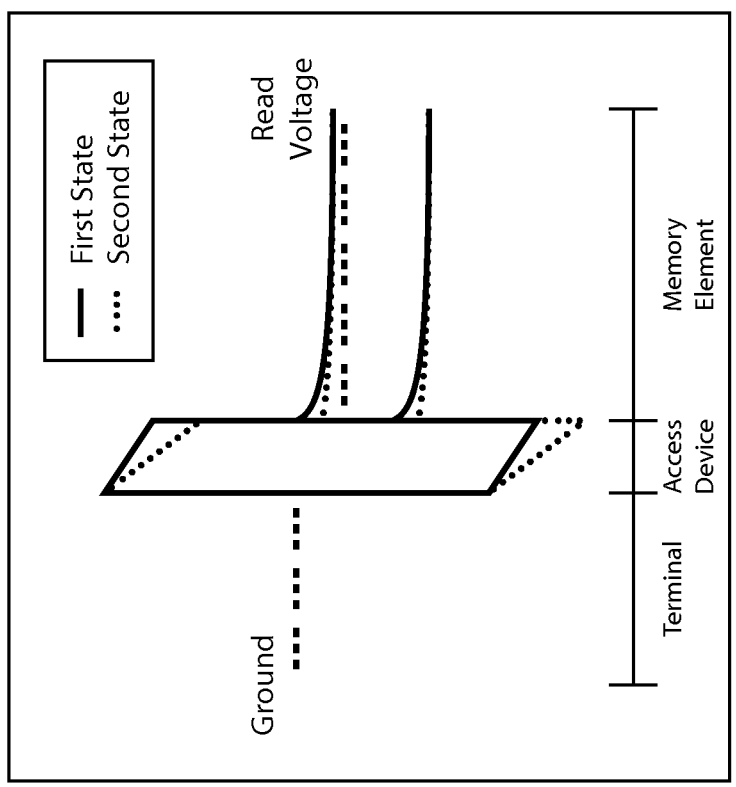
FIG. 5A is a schematic diagram of electrons tunneling through the bidirectional access device during a read operation in accordance to one embodiment of the present invention.
FIG. 5B is table depicting the bias condition per terminal during a read operation, in accordance to one embodiment of the present invention.

FIG. 5A is a schematic diagram of electrons tunneling through the bidirectional access device during a read operation, in accordance to one embodiment of the present invention. The vertical axis representing the energy and the horizontal axis representing the position within the memory cell. The high dielectric constant of the second state results in a greater voltage drop across the bidirectional access device 106 (relative to the first state).

FIG. 5B is table depicting the bias condition per terminal during a read operation, in accordance to one embodiment of the present invention. The first terminal 102 is biased to a read voltage and the second terminal 108 is biased to a ground voltage. As such, the read voltage is applied across the memory element 104 and bidirectional access device 106. In some embodiments, the polarity can be in the opposite direction. In such cases, the second terminal 108 is biased to the read voltage and the first terminal 102 is biased to the ground voltage.

FIGS. 6A-7B are diagrams representing a possible write mechanism for a memory cell in accordance to one embodiment of the present invention. It is understood that the present invention is not restricted to the limitations of the disclosed write mechanism. FIG. 6A is a schematic diagram of electrons tunneling through the bidirectional access device during a first write operation, in accordance to one embodiment of the present invention. The vertical axis representing the energy and the horizontal axis representing the position within the memory cell.

FIG. 6B is table depicting the bias condition per terminal during a first write operation, in accordance to one embodiment of the present invention. The first terminal 102 is biased to a first write voltage and the second terminal 108 is biased to a ground voltage. As such, the first write voltage is applied across the memory element 104 and bidirectional access device 106.

Figures 7A, 7B:
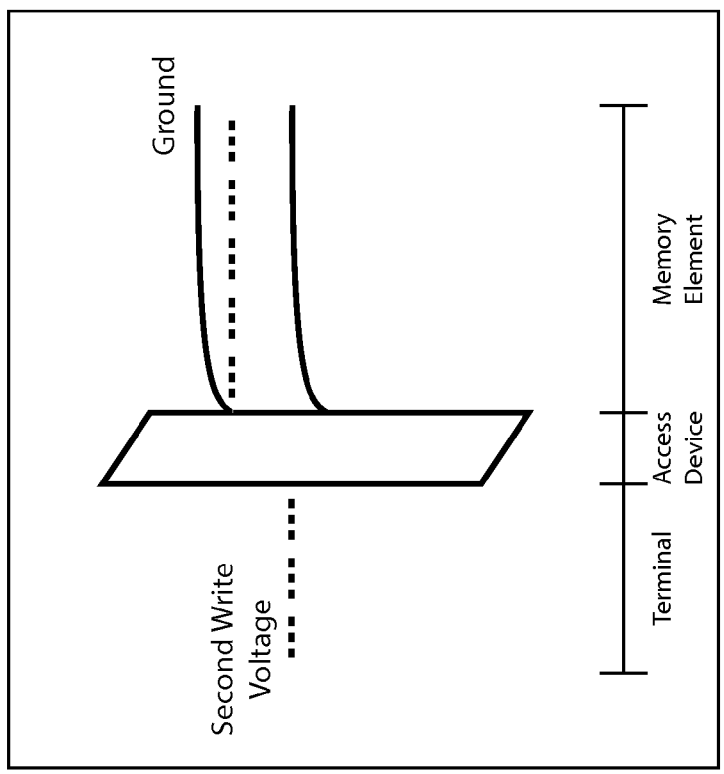
FIG. 7A is a schematic diagram of electrons tunneling through the bidirectional access device during a second write operation in accordance to one embodiment of the present invention.
FIG. 7B is table depicting the bias condition per terminal during a second write operation in accordance to one embodiment of the present invention.

FIG. 7A is a schematic diagram of electrons tunneling through the bidirectional access device during a second write operation, in accordance to one embodiment of the present invention. The vertical axis representing the energy and the horizontal axis representing the position within the memory cell.

FIG. 7B is table depicting the bias condition per terminal during a second write operation, in accordance to one embodiment of the present invention. The first terminal 102 is biased to a second write voltage and the second terminal 108 is biased to a ground voltage. As such, the second write voltage is applied across the memory element 104 and bidirectional access device 106. In some embodiments, the second write voltage is equal in magnitude to the first write voltage, however, the reversed biased conditions result in an equal applied voltage with opposite polarity.

Figure 8:
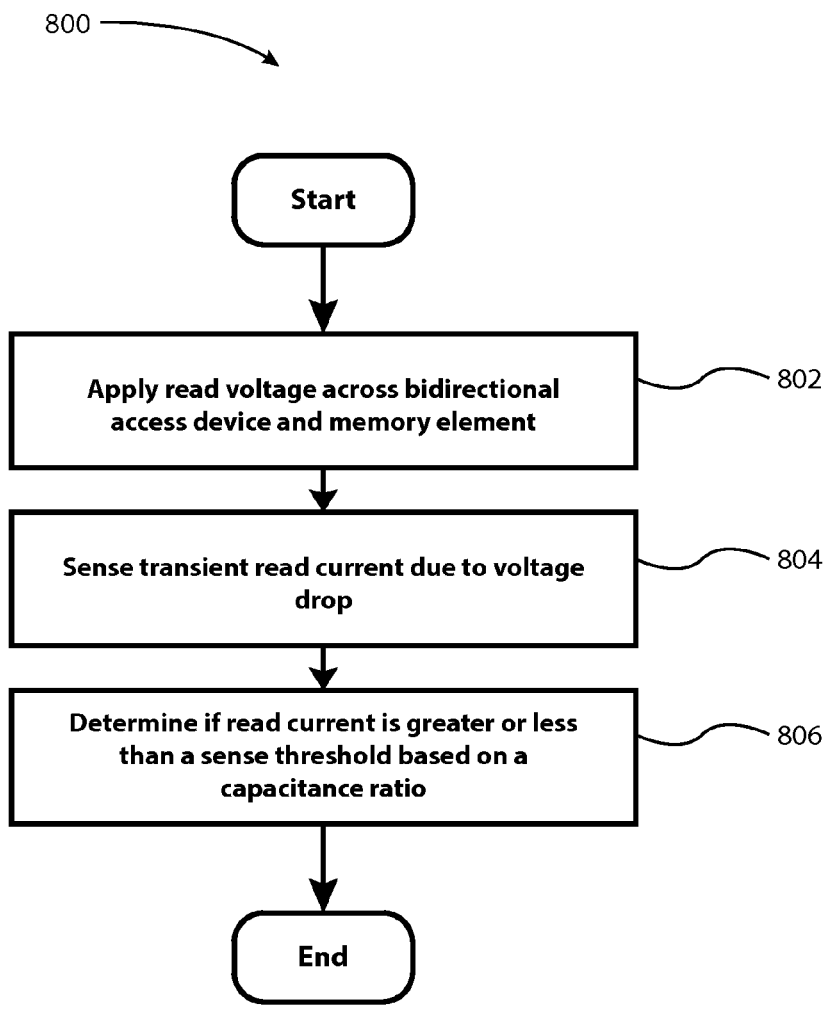
FIG. 8 is a flowchart illustrating an example method of operating a memory cell in accordance to one embodiment of the present invention.

FIG. 8 is a flowchart illustrating an example method of operating a memory cell, in accordance to one embodiment of the present invention. The method begins with applying step 802. At applying step 802, a read voltage is applied across the bidirectional access device 106 and the memory element 104. This can be achieved, for example, by biasing the first terminal 102 and second terminal 108 as displayed in FIG. 5B.

After applying step 802, the method continues to sensing step 804. At sensing step 804 a read unit senses a transient read current due to a voltage drop across the memory element 104 and bidirectional access device 106. One skilled in the art would recognize that the sensing can be achieved with various different mechanisms. After sensing step 804, the method continues to determining step 806. At determining step 806 the state of the memory element is determined based on whether the read current is greater or less than a sense threshold. The sense threshold is based on a ratio between the first capacitance and second capacitance.

What is claimed is:

1. A memory cell comprising:
   a bidirectional access device including a tunneling capacitance;
   a memory element electrically coupled in series circuit with the bidirectional access device, the memory element programmable to one of a first state and a second state, the memory element having a first capacitance at the first state and a second capacitance at the second state, the first capacitance being lower than the second capacitance, the memory element programmable to the first state by application of a first write voltage and programmable to the second state by application of a second write voltage in opposite polarity to the first write voltage; and
   a read unit configured to sense a transient read current due to a voltage drop across the memory element and bidirectional access device upon application of a read voltage.

2. The memory cell of claim 1, wherein the read unit includes a sense threshold for determining if the memory element is programmed to the first state or the second state, the sense threshold being based on a ratio between the first capacitance and the second capacitance.

3. The memory cell of claim 1, further comprising:
   wherein the bidirectional access device includes a tunneling insulator material; and
   wherein the memory element includes a wide bandgap material.

4. The memory cell of claim 1, further comprising:
   a first terminal electrically coupled to the bidirectional access device; and
   a second terminal electrically coupled to the memory element.

5. The memory cell of claim 1, wherein the thickness of the memory element is five nanometers or greater.

6. The memory cell of claim 1, wherein the thickness of the bidirectional access device is between one and five nanometers.

7. The memory cell of claim 1, wherein at least one physical dimension of the bidirectional access device is based on the maximization of the read current.

8. The memory cell of claim 1, wherein at least one physical dimension of the bidirectional access device is based on the maximization of an integral of the read current throughout a read interval.

9. The memory cell of claim 1, wherein the memory element includes at least one of an amorphous carbon material, a silicon carbide material, an aluminum nitride material, a gallium nitride material, and a nitrogen doped amorphous carbon material.

10. The memory cell of claim 1, wherein the memory element includes a first resistance at the first state and a second resistance at the second state, the first resistance being higher than the second resistance.

11. The memory cell of claim 1, wherein the bidirectional access device includes at least one of a silicon oxide material, a silicon nitride material, an aluminum oxide material, a hafnium oxide material, and a magnesium oxide material.

12. The memory cell of claim 1, wherein the memory element laterally surrounds the bidirectional access device.

13. The memory cell of claim 1, wherein the bidirectional access device is stacked proximate the memory element.

* * * * *